US012656165B2

(12) United States Patent
Vandalon

(10) Patent No.: US 12,656,165 B2
(45) Date of Patent: Jun. 16, 2026

(54) CAPACITIVE SENSOR SYSTEM FOR PRECURSOR LEVEL MEASUREMENT AND METHOD THEREFOR

(71) Applicant: ASM IP Holding, B.V., Almere (NL)

(72) Inventor: Vincent Vandalon, Heverlee (BE)

(73) Assignee: ASM IP Holding B.V., Almere (NL)

( * ) Notice: Subject to any disclaimer, the term of this patent is extended or adjusted under 35 U.S.C. 154(b) by 389 days.

(21) Appl. No.: 18/359,629

(22) Filed: Jul. 26, 2023

(65) Prior Publication Data

US 2024/0035872 A1      Feb. 1, 2024

Related U.S. Application Data

(60) Provisional application No. 63/369,695, filed on Jul. 28, 2022.

(51) Int. Cl.
G01F 23/263      (2022.01)
H10P 74/20      (2026.01)

(52) U.S. Cl.
CPC ............ G01F 23/263 (2013.01); H10P 74/20 (2026.01)

(58) Field of Classification Search
CPC ...... G01F 23/263; G01F 23/268; G01F 23/26; H01L 22/10; C23C 16/4483
See application file for complete search history.

(56) References Cited

U.S. PATENT DOCUMENTS

| | | | |
|---|---|---|---|
| 3,161,054 A | 12/1964 | Cohn | |
| 5,617,290 A * | 4/1997 | Kulwicki | H10D 1/682 |
| | | | 361/321.4 |

| | | | |
|---|---|---|---|
| 6,784,083 B1 * | 8/2004 | Gealy | C23C 16/45544 |
| | | | 438/584 |
| 6,988,405 B2 | 1/2006 | Jakoby et al. | |
| 8,474,315 B2 | 7/2013 | Ohshima et al. | |
| 10,378,986 B1 * | 8/2019 | Scardelletti | G01L 9/0073 |
| 10,620,031 B2 * | 4/2020 | Daito | G01F 23/28 |
| 2006/0030057 A1 * | 2/2006 | Hayashi | H10B 53/00 |
| | | | 257/295 |
| 2007/0216424 A1 | 9/2007 | Sieh et al. | |
| 2012/0098032 A1 * | 4/2012 | Guo | H01L 21/02614 |
| | | | 257/E31.026 |
| 2015/0128412 A1 * | 5/2015 | Say | G01N 27/3272 |
| | | | 29/846 |
| 2015/0240354 A1 * | 8/2015 | Han | C23C 16/401 |
| | | | 427/579 |
| 2016/0041021 A1 | 2/2016 | Saitou et al. | |
| 2018/0287050 A1 * | 10/2018 | Madras | H01F 10/3286 |
| 2018/0364089 A1 | 12/2018 | Daito et al. | |
| 2020/0381282 A1 * | 12/2020 | Husain | H01L 21/67069 |
| 2021/0063226 A1 * | 3/2021 | Tang | G01F 23/266 |

FOREIGN PATENT DOCUMENTS

| | | |
|---|---|---|
| CN | 114111965 A | 3/2022 |
| DE | 3706048 A1 | 9/1988 |
| JP | H04-110618 A | 4/1992 |

* cited by examiner

*Primary Examiner* — Dominic E Hawkins
(74) *Attorney, Agent, or Firm* — Banner & Witcoff, Ltd.

(57) ABSTRACT

In the present description, a capacitive sensor system is described by means of which the amount of solid precursor in a precursor vessel for a semiconductor manufacturing process can be determined and to a method for using the same. The system comprises at least two electrodes that are arranged in a substantially parallel manner within the precursor vessel.

20 Claims, 4 Drawing Sheets

CAPACITIVE SENSOR SYSTEM FOR PRECURSOR LEVEL MEASUREMENT AND METHOD THEREFOR

CROSS-REFERENCE TO RELATED APPLICATIONS

This application claims the benefit of U.S. Provisional Application 63/369,695 filed on Jul. 28, 2022, the entire contents of which are incorporated herein by reference.

FIELD

The technology of the present disclosure generally relates to the field of semiconductor processing, and more particularly technology for determining the amount of solid precursor in a precursor vessel for a semiconductor manufacturing process.

BACKGROUND

With semiconductors and semiconductor manufacturing processes becoming more advanced, there is a need for greater uniformity and process control during the manufacturing process.

During processes such as Atomic Layer Deposition (ALD), Epitaxy and Chemical Vapor Deposition (CVD) precursors which may be in the form of a gas, liquid or solid are deposited onto or contacted with a workpiece. These precursors are often stored in precursor container or precursor vessel from where they are transported to the workpiece in the reaction chamber.

While the process is being performed, it may be advantageous to monitor the amount of precursor in the precursor vessel in order to prevent manufacturing defects due to exhaustion of the precursor material. The ability to monitor remaining amount of precursor material in the precursor vessel is important because it ensures process quality, allows efficient scheduling of precursor vessel changes, maximizes use of expensive chemistry, and improves inventory management.

Whereas level sensing is industry standard for gaseous or liquid materials, monitoring the remaining amount of a solid precursor material is more complex. Typically, the precursor material is transported from the precursor vessel to the reactor chamber by flowing a carrier gas through the precursor vessel, thereby generating a process gas comprising the carrier gas and vaporized solid precursor which is subsequently provided to the process chamber. Several of the process conditions employed to the manufacturing process (e.g. high temperature range, the use of carrier gas . . . ) result in the monitoring of the precursor level becoming challenging for existing level sensing systems especially when resolution and accuracy are key.

Therefore, a need exists for an improved method and apparatus for monitoring the amount of solid precursor in a precursor vessel for a semiconductor manufacturing process.

SUMMARY

In the present description, technology is described by means of which the amount of solid precursor in a precursor vessel for a semiconductor manufacturing process can be determined. Reliable sensing of the precursor level in a vessel is key for (resource) planning, error detection, quality assurance, amongst other operating factors. The herein disclosed technology may improve the accuracy and consistency of precursor measurement.

Additionally, the herein disclosed technology can be used for out or in-place precursor vessel measurements. The latter are preferred as they can be done without tool downtime. Moreover, because in-place monitoring allows near real-time monitoring, it can also be used for error detection (e.g. precursor flushed away) or quality control. For example, the last 20% of chemical should not be used because the resulting film might be of lower quality due to impurities.

A first overview of various aspects of the technology of the present disclosure is given hereinbelow, after which specific embodiments will be described in more detail. This overview is meant to aid the reader in understanding the technological concepts more quickly, but it is not meant to identify the most important or essential features thereof, nor is it meant to limit the scope of the present disclosure, which is limited only by the claims.

An aspect of the present disclosure relates to a method for determining the amount of solid precursor in a precursor vessel for a semiconductor manufacturing process; wherein said vessel has an interior portion configured for receiving and holding the solid precursor, comprising at least two electrodes that are arranged in a substantially parallel manner within said vessel;

the method comprising the steps of:

applying an electrical signal to each one of said electrodes to electrically excite them such that an electric field is formed inside said vessel's interior portion;

capturing sensing data indicative of capacitance related to the amount of precursor within said electric field; and determining, based on said sensing data, said amount of precursor in said precursor vessel.

In some embodiments the electric field extends substantially uniformly throughout the precursor, whereby the electric field lines of said electric field are locally parallel.

In some embodiments the determining of the amount of precursor in the precursor vessel comprises calculating, based on the sensing data, the fraction of said vessel's interior portion which contains precursor.

In some embodiments the determining further comprises applying a mathematical model that describes the relationship between said fraction and the amount of precursor in the precursor vessel, preferably based on calibration data.

In some embodiments the determining further comprises looking up a corresponding value in a calibration curve and/or look-up table that describes the relationship between said fraction and the amount of precursor in said precursor vessel, preferably based on calibration data.

In some embodiments the method further comprises the step of calculating a consumption rate of said precursor based on said sensing data over time.

In some embodiments the precursor vessel comprises a support structure mounted within said vessel's interior portion to support precursor coated thereon; wherein said support structure comprises one or more conductive material configured to operate as one or more electrodes.

In some embodiments the support structure comprises a non-conductive core material and a conductive peripheral material.

In some embodiments the support structure comprises at least one of a matrix, mesh, grid, fabric, screen, and/or perforated screen.

In some embodiments the support structure comprises at least one of a plurality of substrates, porous substrates, granules, and/or grids, preferably stacked onto each other.

In some embodiments at least one electrode is mounted substantially along a bottom of the precursor vessel, and at least one electrode is mounted substantially along a top of said vessel.

In some embodiments the precursor vessel comprises a pair of electrodes arranged in a cascading manner along a height of said precursor vessel, thereby substantially forming a plurality of alternating substantially horizontal and substantially vertical sections.

In some embodiments the precursor vessel comprises a support member; and wherein the electrodes are mounted in a winding manner around said support member, thereby substantially forming a double helix; and wherein said support member is mounted along a height of said precursor vessel.

In some embodiments the precursor vessel comprises a plurality of electrode pairs that are capacitively coupled to thereby form a plurality of electrode units; wherein said plurality of electrode units is mounted along a height of said precursor vessel; and wherein the electrical signal is applied to each one of said electrode units to thereby electrically excite them such that a plurality of electric fields is formed inside said vessel's interior portion.

In some embodiments at least one surface of an electrode is configured to prevent electrical arcing.

In some embodiments at least one surface of an electrode is covered by an insulating coating or comprises an insulating material mounted thereon.

In some embodiments the electrical signal applied to said electrodes has a voltage of 24 V or lower, preferably 10 V or lower; more preferably 5 V or lower.

In some embodiments the electrical signal applied to said electrodes has a drive current of 50 µA or lower, preferably 10 µA or lower; more preferably 1 µA or lower.

In some embodiments the electrical signal applied to said electrodes is an AC signal with a frequency between 10 kHz and 1 MHz.

Another aspect of the present disclosure relates to a capacitive sensor system for measuring the amount of solid precursor in a precursor vessel for a semiconductor manufacturing process, said vessel having an interior portion configured for receiving and holding the solid precursor; the system comprising:

at least two electrodes configured to be mountable within said interior portion in a substantially parallel manner;

a controller configured to apply an electrical signal to each one of said electrodes to thereby electrically excite them such that an electric field is formed inside the vessel's interior portion, and capture sensing data indicative of capacitance related to an amount of precursor within said electric field; and, a processing device communicatively coupled to the controller in order to receive the sensing data therefrom, and configured to determine, based on said sensing data, the amount of precursor in said precursor vessel.

Another aspect of the present disclosure relates to a processing system comprising a process chamber, a substrate handling system, and a precursor vessel; wherein the precursor vessel has an interior portion holding a solid precursor; and, the processing system comprises a capacitive sensor system according to an embodiment as described in the present disclosure.

In some embodiments the processing system further comprises a process control unit configured for causing the processing system to carry out a method according to an embodiment as described in the present disclosure.

BRIEF DESCRIPTION OF THE DRAWINGS

The following description of the figures relate to specific embodiments of the disclosure which are merely exemplary in nature and not intended to limit the present teachings, their application or uses.

Throughout the drawings, the corresponding reference numerals indicate the following parts and features: capacitive sensor system (1); interior portion of a precursor vessel (2); precursor (3); electrodes (4, 4'); controller (5); field lines (6); support structure (7); substrate (8); support member (9).

DETAILED DESCRIPTION

Figure 1:
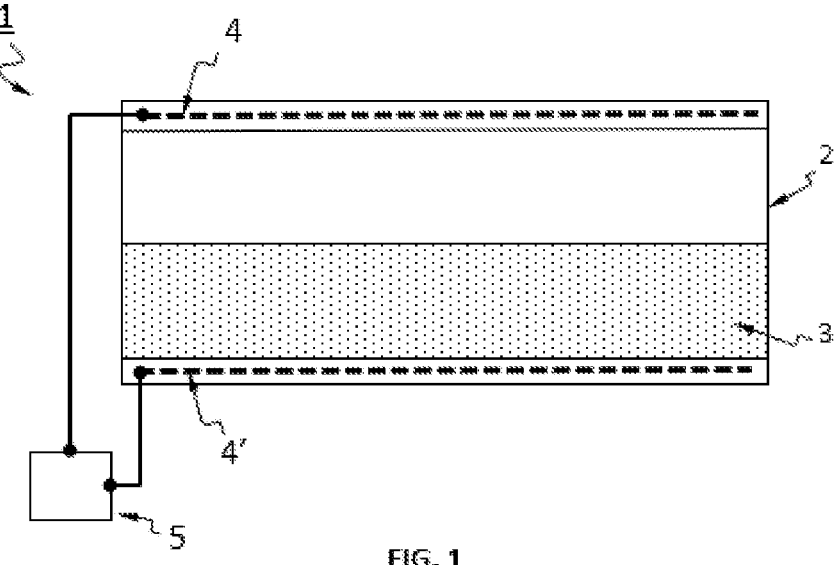
FIG. 1 shows an embodiment of a capacitive sensor system 1 comprising a pair of capacitively coupled electrodes 4,4' mounted oppositely along a top and bottom of a precursor vessel's interior portion 2.

In the following detailed description, the technology underlying the present disclosure will be described by means of different aspects thereof. It will be readily understood that the aspects of the present disclosure, as generally described herein, and illustrated in the figures, can be arranged, substituted, combined, and designed in a wide variety of different configurations, all of which are explicitly contemplated and make part of this disclosure. This description is meant to aid the reader in understanding the technological concepts more easily, but it is not meant to limit the scope of the present disclosure, which is limited only by the claims.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment.

As used herein, the terms "comprising", "comprises" and "comprised of" as used herein are synonymous with "including", "includes" or "containing", "contains", and are inclusive or open-ended and do not exclude additional, non-recited members, elements or method steps. The terms "comprising", "comprises" and "comprised of" when referring to recited members, elements or method steps also include embodiments which "consist of" said recited members, elements or method steps. The singular forms "a", "an", and "the" include both singular and plural referents unless the context clearly dictates otherwise.

As used herein, relative terms, such as "left," "right," "front," "back," "top," "bottom," "over," "under," etc., are used for descriptive purposes and not necessarily for describing permanent relative positions. It is to be understood that such terms are interchangeable under appropriate circumstances and that the embodiment as described herein are capable of operation in other orientations than those illustrated or described herein unless the context clearly dictates otherwise.

Objects described herein as being "adjacent" to each other reflect a spatial relationship between the described objects, that is, the term indicates the described objects must be arranged in a way to perform a designated function which include a direct (i.e. physical) or indirect (i.e. close to or near) physical contact, as appropriate for the context in which the phrase is used.

Objects described herein as being "connected" or "coupled" reflect a functional relationship between the described objects, that is, the terms indicate the described objects must be connected in a way to perform a designated function which may include a direct or indirect connection in an electrical or nonelectrical (i.e. physical) manner, as appropriate for the context in which the term is used.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result.

As used herein, the term "about" is used to provide flexibility to a numerical value or range endpoint by providing that a given value may be "a little above" or "a little below" said value or endpoint, depending on the specific context. Unless otherwise stated, use of the term "about" in accordance with a specific number or numerical range should also be understood to provide support for such numerical terms or range without the term "about". For example, the recitation of "about 30" should be construed as not only providing support for values a little above and a little below 30, but also for the actual numerical value of 30 as well.

The recitation of numerical ranges by endpoints includes all numbers and fractions subsumed within the respective ranges, as well as the recited endpoints. Furthermore, the terms first, second, third and the like in the description and in the claims, are used for distinguishing between similar elements and not necessarily for describing a sequential or chronological order, unless specified. It is to be understood that the terms so used are interchangeable under appropriate circumstances and that the embodiments of the disclosure described herein are capable of operation in other sequences than described or illustrated herein.

Reference in this specification may be made to devices, structures, systems, or methods that provide "improved" performance (e.g. increased or decreased results, depending on the context). It is to be understood that unless otherwise stated, such "improvement" is a measure of a benefit obtained based on a comparison to devices, structures, systems or methods in the prior art. Furthermore, it is to be understood that the degree of improved performance may vary between disclosed embodiments and that no equality or consistency in the amount, degree, or realization of improved performance is to be assumed as universally applicable.

In the present description, technology is described by means of which the amount of solid precursor in a precursor vessel for a semiconductor manufacturing process can be determined. Reliable sensing of the precursor level in a vessel is key for (resource) planning, error detection, quality assurance, amongst other operating factors. The herein disclosed technology may improve the accuracy and consistency of precursor measurement.

Additionally, the herein disclosed technology can be used for out or in-place precursor vessel measurements. The latter are preferred as they can be done without tool downtime. Moreover, because in-place monitoring allows near real-time monitoring, it can also be used for error detection (e.g. precursor flushed away) or quality control. For example, the last 20% of chemical should not be used because the resulting film might be of lower quality due to impurities.

Unless otherwise defined, all terms used in describing the technology, including technical and scientific terms, have the meaning as commonly understood by one of ordinary skill in the art to which this disclosure belongs. By means of further guidance, definitions for the terms used in the description are included to better appreciate the teaching of the present disclosure. The terms or definitions used herein are provided solely to aid in the understanding of the technology.

As referred to herein, the term "solid precursor" refers to the solid chemical compounds used in semiconductor manufacturing techniques, such as CVD and ALD, to be deposited onto the surface of substrate in a thin layer or as an atomic layer. The precursor material is selected based on the process performed in the process chamber. Furthermore, the solid precursor may be provided in many forms including powders, granules, but also solids adhered onto an inert scaffolding. Ideally this scaffolding should not interact with the precursor to ensure both quality (precursor altered by the measurement) and safety (heating, sparking, etc.).

In an embodiment the solid precursor may comprise a metal, more particularly, said metal may be selected from an alkaline metal, an alkaline earth metal, a transition metal, a transition metal, a rare earth metal or a combination thereof. The precursor may also comprise one or more ligands, the one or more ligands being selected from H, halogens, alkyls, alkenyls, alkynes, carbonyls, dienyls, beta-diketonates, substituted or unsubstituted cyclodienyls, substituted or unsubstituted aryls or a combination thereof. Suitable halogens include F, Br, Cl, and/or I. Suitable alkyls, alkenyls, alkynes, dienyls, and cyclodienyls are typically C1 to C8 compounds. Suitable substituents on the cyclodienyls and aryls include C1 to C3 alkyls. Suitable beta-diketonates include 1,1,1,5,5-hexafluoropentane-2,4-dionate (hfac) and/or 2,4-pentanedione (hacac). In embodiment the precursor may be a homoleptic chemical compound (a metal compound where all ligands are identical) or a heteroleptic chemical compound (a metal compound having two or more different types of ligands). In an embodiment the precursor may comprise a metal-carbon bond. In an embodiment the precursor may comprise a metal pi complex. An exemplary solid precursor is $HfCl_4$.

It will be observed that the herein described technology is described primarily with reference to solid precursor. The reason for this is that technology for reliable measurement of liquid precursor is known in the art, such as the use of floaters. However, such technology cannot be reliably applied to measurement of solid precursor level, which is more complex due to a lack of definite volume and possible agglomeration (e.g. clumping). Nevertheless, the skilled person appreciates that the herein described technology can also be utilised for measurement of liquid precursor, or a mixture of solid and liquid precursor. For the sake of brevity, however, such embodiments will not be described separately, but they are nevertheless explicitly anticipated within the scope of the present disclosure.

The above-described solid precursor may be typically stored in a "precursor vessel", which may comprise a chamber consisting of a hollow void formed within the body of said precursor vessel. This chamber may include a top, a bottom, and one or more surrounding sidewalls enclosing an interior portion, and an opening for accessing said interior portion. The interior portion may be configured for receiving and holding of the precursor via said opening. The precursor vessel may also be configured to reach and maintain different temperatures within said interior portion depending on the received precursor. Typical temperatures may range between 120° C. to 200° C., but the present disclosure is not limited to any particular temperature range.

The precursor vessel may be part of a "processing system", which typically further comprises a "process chamber" coupled to a "solid delivery system". The process chamber may include an inner volume with a substrate support disposed therein for supporting a substrate to be processed (such as a semiconductor wafer or the like). The process chamber may be configured for ALD, CVD, or the like. The processing system may comprise additional components, for example, one or more RF or other energy sources for generating a plasma within the inner volume or for providing RF bias to a substrate disposed on the substrate support.

Further, the solid delivery system may comprise a gas source and a precursor vessel configured for receiving and holding of a precursor. The gas source may be coupled to the process chamber for providing one or more process gases to the inner volume of the chamber. In some embodiments the gas source may include a mass flow controller or other suitable device for controlling the quantity of gas provided from the gas source. Alternatively or in combination, the gas source may be coupled to a mass flow controller or other suitable device for controlling the quantity of gas provided from the gas source. The process gases may enter the chamber via an inlet, such as a showerhead, a nozzle, or other suitable gas inlet apparatus. Unreacted process gases, gas by-products, or like may be removed from the inner volume via an exhaust system coupled to the chamber.

An overview of various aspects of the technology of the present disclosure is given hereinbelow, after which specific embodiments will be described in more detail. This overview is meant to aid the reader in understanding the technological concepts more quickly, but it is not meant to identify the most important or essential features thereof, nor is it meant to limit the scope of the present disclosure, which is limited only by the claims. When describing specific embodiments, reference is made to the accompanying drawings, which are provided solely to aid in the understanding of the described embodiment.

An aspect of the present disclosure relates to a method for determining the amount of solid precursor in a precursor vessel for a semiconductor manufacturing process;

wherein said vessel has an interior portion configured for receiving and holding the precursor, and comprises at least two electrodes that are arranged in a substantially parallel manner within said vessel; the method comprising the steps of:

applying an electrical signal to each one of said electrodes to electrically excite them such that an electric field is formed inside the vessel's interior portion;

capturing sensing data indicative of capacitance related to the amount of precursor within said electric field; and determining, based on said sensing data, said amount of precursor in said precursor vessel.

Another aspect of the present disclosure relates to a capacitive sensor system for measuring the amount of solid or liquid precursor in a precursor vessel for a semiconductor manufacturing process, the system comprising:

the precursor vessel having an interior portion configured for receiving and holding the precursor;

at least two electrodes that are arranged in a substantially parallel manner within said vessel; and, a controller configured to apply an electrical signal to each one of said electrodes to thereby electrically excite them such that an electric field is formed inside the vessel's interior portion, and capture sensing data indicative of capacitance related to an amount of precursor within said electric field; and, a processing device communicatively coupled to the controller in order to receive the sensing data therefrom and configured to determine, based on said sensing data, the amount of precursor in said precursor vessel.

Another aspect of the present disclosure relates to a processing system comprising a process chamber, a substrate handling system, and a precursor vessel; wherein the precursor vessel holds an amount of solid precursor, and the processing system comprises a capacitive sensor system as described herein. In an embodiment the processing system may comprise a process control unit configured for causing the processing system to carry out a method as described herein.

The capacitive sensor system 1 of the present disclosure is discussed in more detail with reference to FIG. 1, which schematically shows an embodiment of a pair of electrodes 4,4' mounted on a portion of a precursor vessel, specifically a first electrode that is mounted along a bottom wall enclosing an interior portion 2 of said vessel, adjacent to a precursor 3 to be measured, and a second electrode mounted substantially parallel to said first electrode.

A voltage difference V applied between electrodes 4 will induce opposite charges on each electrode, causing them to become capacitively coupled and form an electric field that extends from one electrode to the other, across said vessel's interior portion 2. The capacitance of a material having a dielectric different from a set reference value can be measured (standard unit Farad (F)) when is it is placed inside said electric field. The material's capacitance is dependent on the material (e.g. chemical, amount) and the electrode configuration (e.g. voltage, geometry, distance, etc.). Since the precursor chemical and all electrode parameters are known, therefore, the amount of material can be calculated based on the measured capacitance.

The applied electric field extends substantially "uniformly" throughout the precursor, whereby the electric field lines of said electric field are advantageously locally parallel with respect to each other. Substantially uniform as used within the context of the present application refers to the field lines being evenly divided throughout the "capacitive sensing area" of the capacitive sensor, defined as the area covered by the electric field between the capacitively coupled electrodes, advantageously covering most if not all of the vessel's interior portion, apart from, for example, field lines at the vessel's edges or parts containing little to no precursor. It is appreciated that electrical contact with the precursor is not required for sensing; it is sufficient that the precursor is suspended within the electrical field. In some embodiments, a substantially uniform electric field can have a magnitude that is constant within the precursor vessel, for example within a margin of error of 30%, 20%, 10%, 5%, 2%, or 1%.

Figure 2:
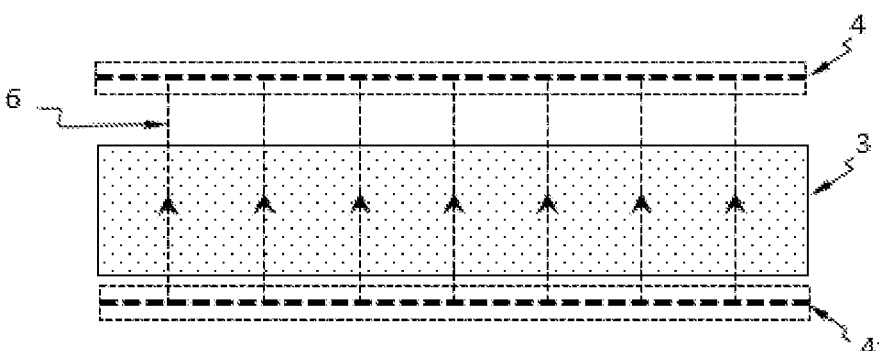
FIG. 2 shows an embodiment of a pair of straight electrodes 4,4' arranged in a substantially parallel manner.

An example of completely uniform field lines is illustrated in FIG. 2, which shows a close up of precursor 3 suspended in an electrical field formed between a pair of capacitively coupled electrodes 4, 4'. In the illustrated example the electrodes 4 comprise straight electrode plates that are arranged in a completely parallel manner. The electric field lines 6 in such an electrode configuration run locally parallel throughout the sensor's entire capacitive sensing area. As a result, the shown capacitive sensor is equally sensitive to the presence of precursor at any location within its sensing area. This is particularly relevant for accurate measurement of solid precursor because solids can often "clump together" so it is not sufficient to measure the local precursor level at one location. Advantageously the electrical field fully covers the interior portion, or at least the section of said interior portion containing any precursor.

However, when practically implementing a capacitive sensor, some deviation from a completely parallel arrangement of the electrodes may be expected. The tolerance in how parallel the electrode arrangement must be is specific to the geometry and the desired sensitivity to the detected material. Capacitance scales with $1/d$, with d being the interelectrode distance between the plates. Hence, when considering an electrode with a fixed size, increasing d will decrease the impact of a deviation from a completely parallel arrangement. The concept does not fail beyond a critical point, it gradually becomes less reliable due to higher sensitivity to precursor in hot spots with higher electric field. Consequently, deviation from a uniform electric field may result in a location dependent sensitivity. This effect is more pronounced for electrodes arranged in close proximity.

Therefore, it is understood that electrodes described herein as being arranged "substantially parallel" reflect a functional relationship between said electrodes, whereby the electrodes are arranged in a parallel manner to reliably perform the capacitive sensing at the desired sensor sensitivity, i.e., the sensing error for the entire capacitive sensing area, when considering the uniformity of the electric field and any local deviations therefrom. For example, a sensitivity of ±1 pF may be sufficient to reliably estimate the precursor level for a typical manufacturing process. However, it is understood that the sensitivity might be adjusted (increased/decreased) depending on the process and precursor. In some embodiments, the electrodes may have a sensitivity of ±25 pF, ±20 pF, ±15 pF, ±10 pF, ±5 pF, ±1 pF or less.

In an exemplary approximation, the measurement error will be the interior portion's volume fraction exhibiting a non-uniformity multiplied by the value of said non-uniformity. For example, if 10% of the space between the electrodes has a 20% higher field, the error in the measurement will be 0.1*0.2=2%. If this space is occupied by chemical, the measured chemical volume will be off by roughly 2%. In practice, a vessel is often replaced when 20% of the original chemical is remaining due to quality risk (e.g. lower partial pressure in the evaporated chemical), so a measurement error in the 1% range can be regarded as acceptable provided that the local deviation does not exceed an acceptance threshold. In some embodiments the measurement error may be less than 5%, preferably less than 4%, more preferably less than 3%, more preferably still less than 2%, more preferably still less than 1%.

Nonetheless, even if local non-uniformities occur in the applied electrical field which could result in local measurement errors, the configuration of the electrodes and/or the vessel's interior portion can be adapted such to avoid or minimise measurements in a non-uniform region of said electrical field. In some embodiments precursor may be partially of fully blocked from residing in a non-uniform region, for example by placing a blocking element in said region. Alternatively or in combination, the presence of precursor may be promoted in a uniform region, for example through the provision of a substrate.

Another factor to consider is the geometry of the precursor vessel and its interior portion in particular. A typical vessel is cylindrical, and elongate, with rounded top and bottom parts, with a diameter-to-longitudinal axis ratio of 2 to 10, e.g. 4 to 6, and a possible diameter from at least cm to at most 40 cm, although a spherical configuration is also possible. Edges are rounded because the vessels need to handle mechanical stresses related to operation under vacuum.

Additionally, some solid precursor vessels can feature low profile/low level of precursor with a very high surface area, making resolution of vertical chemical level extremely critical more so than for a tall, cylindrical vessel with a relatively large initial fill level. These vessels typically exhibit non uniform lateral consumption over surface area and flow path direction, further complicating level sensing requirements.

The inner structure of a precursor vessel can be a meandering flow path, such as for crossflow plates in distillation columns. Alternatively, the inner structure of the precursor vessel can be an open celled foam the inner pores of which are coated with solid precursor. Alternatively, the precursor vessel can be a vessel packed with a precursor-coated packing material.

To accommodate the geometry of such a precursor vessel, the provision of at least partially curved electrodes may be contemplated. Advantageously the curved electrodes may be adapted to the geometry of the vessel, e.g. shape and curvature, specifically the geometry of the vessel's interior portion. Nonetheless, similar requirement regarding uniformity as discussed above for exemplary straight electrodes are applicable to curved electrodes. Specifically, the electric field lines in a curved electrode configuration advantageously run locally parallel throughout the sensor's entire capacitive sensing.

Figure 3:
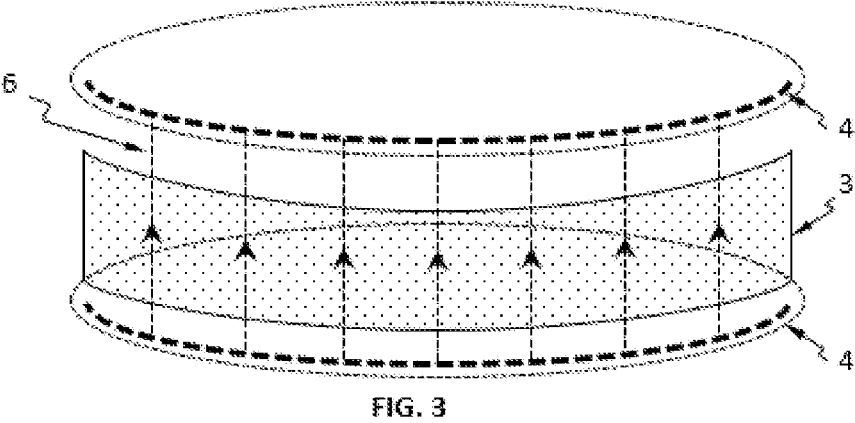
FIG. 3 shows an embodiment of a pair of curved electrodes 4,4' arranged in a substantially parallel manner.

An example of a pair of capacitively coupled curved electrodes 4, 4' is illustrated in FIG. 3. In the illustrated example the electrodes 4 comprise curved electrode plates that are arranged completely parallel by considering the curvature of each electrode such that the electric field lines 6 run locally parallel within the sensor's capacitive sensing area still. The shown embodiment may allow for including the edges of a cylindrical vessel in the capacitive sensing area, which could otherwise create a sensing blind spot for an embodiment only comprising straight electrodes.

Referring back to FIG. 1, it is shown that system 1 further comprises controller 5, which is electrically coupled to electrodes 3 to apply an electrical signal thereto—indicated by the solid line with bullet endings. It is understood that the shown electrical connection is for illustrative purposes only as various forms of connections known in the art could be implemented, direct or indirect. The connections may advantageously be adapted for better integration within a precursor vessel. Moreover, controller 5 is illustrated as positioned adjacent to interior portion 2, but embodiments may be contemplated whereby the controller is arranged outside the precursor vessel.

The controller is illustrated as a single unit. The skilled person, however, understands that the controller may comprise various components for controlling the operation thereof. The controller generally comprises a central processing unit (CPU), a memory, and support circuits for the CPU. The controller may control the processing system directly, or via computers (or controllers) associated with particular components thereof.

The controller may be one of any form of general-purpose computer processor that can be used in an industrial setting for controlling various processes. The memory, or computer-readable medium of the CPU may be one or more of readily available memory such as random-access memory (RAM), read only memory (ROM), hard disk, flash, or any other form of digital storage, local or remote. The support circuits are coupled to the CPU for supporting the processor in a conventional manner. These circuits include cache, power supplies, clock circuits, input/output circuitry and subsystems, and the like.

In an embodiment the controller may be configured to apply an electrical signal to the electrodes with a voltage of 24 V or lower, preferably 10 V or lower; more preferably 5 V or lower. Advantageously the controller is configured to operate at lower voltage to reduce the risk for electrical arcing within the interior portion.

In an embodiment a surface of at least one electrode is configured to prevent electrical arcing by said electrode. Preferably, the electrode surface may be covered by an insulating coating and/or comprises an insulating material mounted thereon. An example of an insulating material may include a ceramic or a material comprising ceramic. The risk of arcing can also be reduced by providing a buffer between the electrode and precursor. Advantageously the buffer is electrically nonconductive such as to not interact with the formed electrical field.

In an embodiment the controller may be configured to apply an electrical signal to the electrodes with a drive current of 50 µA or lower, preferably 10 µA or lower; more preferably 1 µA or lower. Advantageously the controller is configured to operate with a lower drive current so at to minimise heating of the precursor.

In an embodiment the controller may be configured to apply an electrical AC signal to the electrodes with a frequency between 10 kHz to 1 MHz. This frequency range also relates to the read-out speed; in particular, with 1 MHz the capacitance of the sensor can be read out at 10 kHz. In an alternative embodiment a virtually DC signal could also be applied.

The system 1 shown in FIG. 1 may further comprise a processing device which is electrically coupled to electrodes 3 to receive an electrical signal therefrom indicative of capacitance related to an amount of precursor 2 within the electric field created across the vessel's interior portion 2. This electrical signal is hereinafter referred to as sensing data. Alternatively or in combination, the processing device may be communicatively coupled to the controller in order to receive the sensing data therefrom. In a preferred embodiment the processing device and the controller are part of a single control unit. This may reduce the complexity of the system, and also allow for easier integration of the sensing device into the precursor vessel.

Based on the received sensing data, the processing device may be configured to determine the amount of precursor in said precursor vessel. Moreover, based on the determined amount, the processing may be configured to determine various parameters relevant to process control. Hereinunder various embodiments of the processing device will be described, but the present disclosure is not limited thereto as new or alternative data processing techniques can be easily implemented in the form of software.

In an embodiment the processing device may be configured for determining the amount of precursor in said precursor vessel by calculating, based on said sensing data, the fraction of said vessel's interior portion which contains precursor. In typical operation, the time until refilling or swapping the precursor vessel may be primarily based on the fill fraction of the precursor level. Active monitoring of the fill fraction can thereby allow for a timely intervention such that high process efficiency can be maintained without risking low precursor level.

In a further embodiment the determining may further comprise applying a mathematical model that describes the relationship between said fraction and the amount of precursor in the precursor vessel, preferably based on calibration data. Preferably, the method may comprise determining up a value representing the amount of precursor, such as weight, by referring to a set of standard datapoints of a known amount, such as a calibration curve or a calibration look-up table. These standard datapoints may be obtained by measuring a known amount of precursor at different fill fractions of the precursor vessel when calibrating the system.

Various statistical analyses may be considered for choosing the best model fitting to the available calibration data and also evaluate the parameters (e.g. linearity) of the applied model. As such, the skilled person appreciates that the herein disclosed technology is not limited to any particular model and different models may be contemplated based on the process and precursor. Nonetheless, applying interpolation can be considered as a particularly reliable estimation method for determining an unknown value based on the value of previously measured datapoints, e.g., for an empty to full precursor vessel.

In an embodiment the processing device may be configured for calculating a consumption or consumption rate (mg/s dosing or mg/per pulse) of said precursor based on said sensing data over time. Monitoring consumption may be advantageous for quality control. For example, a higher/lower than normal consumption can indicate tool issues, such as dumping of precursor due to (human) error in operating the tool/valves, or the carrier flow picking up the chemical may be out of spec due to a faulty flow controller/sensor. Such tool issue can be easily detected by monitoring the consumption rate and comparing it to a predefined (normal) consumption rate value. The monitoring can be automated based on the controller configuration.

In an embodiment the system may comprise a temperature sensor configured for determining the temperature of the precursor, advantageously by measuring the temperature within the interior portion holding said precursor. The processing device may be further configured to receive temperature data from said temperature sensor and adjust a calculation of the precursor amount based on said temperature data.

The provision of a temperature sensor may increase the sensing accuracy for temperatures that cause fluctuations in the precursor phase. However, for temperatures below 400° C., only a minor fraction of the liquid/solid is in the vapor phase in the vessel. Hence, the provision of a temperature sensor can be advantageously contemplated for high temperatures, depending on the precursor type, but may be redundant for temperatures typically used for solid precursor.

Referring yet again to FIG. 1, in the illustrated embodiment a first electrode 4 is arranged along a top wall of the precursor vessel, which forms the top of the vessel's interior portion 2, and a second electrode 4' is arranged along a bottom wall of said vessel, which correspondingly forms the bottom of said interior portion 2.

As previously discussed, typical precursor vessels are cylindrical with rounded top and bottom parts. Hence there is only one pair of facing sides which allows for mounting a pair of electrodes in a substantially parallel manner. Mounting electrodes along the curved sidewall risk could result in increased sensitivity at a position where the plates meet and reduced sensitivity at the position where the plates are most distant. Nonetheless, the skilled person appreciates that such considerations do not apply to different vessel geometries, such as cubic/cuboid vessels, which would allow arranging the electrodes along any pair of facing sides.

Figure 4:
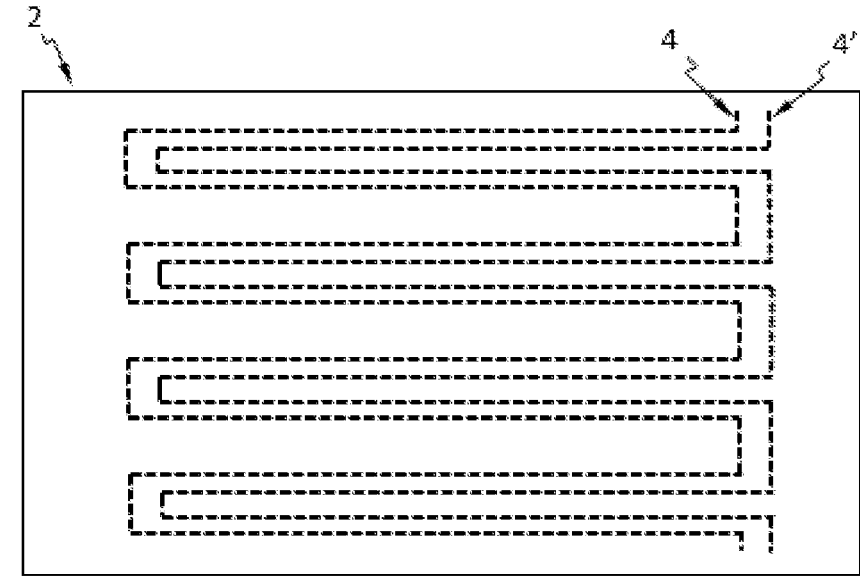
FIG. 4 shows an embodiment of a capacitive sensor system 1 comprising a pair of capacitively coupled electrodes 4,4' mounted in a cascading manner in a precursor vessel's interior portion 2.

With reference to FIG. 4, an embodiment is described wherein the pair of electrodes 4,4' is arranged in a cascading manner, such that a plurality of substantially horizontal and substantially vertical sections is formed inside said vessel's interior portion 2. Preferably, the electrodes are mounted along a height of the vessel, with the horizontal sections being advantageously longer than the vertical sections. The skilled person understands that the horizontal and vertical sections are only exemplary in nature and that variations on the cascading configurations may be implemented. For example, at least part of the electrode may have a diagonal or rounded section, which may be used to skip sections of the interior portion wherein little to no precursor is expected.

An embodiment comprising electrodes in a cascading configuration has the advantage of increasing the surface area of the capacitive sensor, without sacrificing (too much) uniformity. In particular, rather than forming one extensive electrical field spanning across the entire interior portion, which would result in a great distance between the electrode, a more compact electrical field is formed that runs throughout the interior portion, thereby keeping the electrode distance low in order to improve sensitivity.

In an embodiment the precursor vessel may comprise a support structure mounted within said vessel's interior portion to support precursor coated thereon. The precursor may be coated onto via sublimation, liquid coating, precipitation from solution, or other coating techniques known in the art. The support structure may comprise one or more conductive material configured to operate as one or more electrodes. Preferably, the support structure comprises a non-conductive core material and a conductive peripheral material. For example, a non-conductive core material may be coated with a conductive coating or comprise a conductive material mounted thereon. This advantageously allows for integration of the sensing system into existing support structures of precursor vessels.

Figure 5:
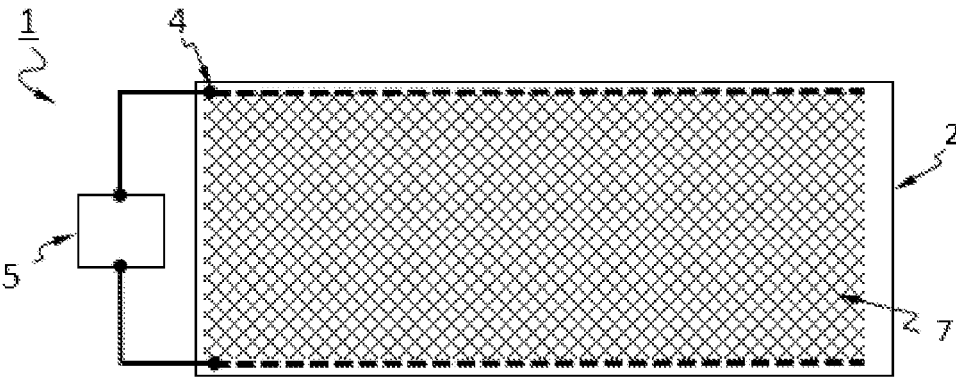
FIG. 5 shows an embodiment of a capacitive sensor system 1 comprising a support structure in the form of a matrix 7 mounted in a precursor vessel's interior portion 2, that is configured as an electrode 4.

With reference to FIG. 5, an embodiment of a support structure is shown which comprises a matrix 7 arranged along the height of the vessel's interior portion 2. At least one of the electrodes 4 is shown to be electrically connected to matrix 7, thereby forming an electric field between said matrix 7 and the other electrode. Alternatively or in combination, matrix 7 may be directly connected to controller 5, thereby forming an electrode of the pair of electrodes 4,4'.

In alternative embodiments the support structure may comprise a matrix, mesh, grid, fabric, and/or screen, which is optionally perforated. Such an embodiment may allow for controlling the position of the precursor in high sensing accuracy zones and preventing agglomeration of precursor in lower sensing accuracy zones.

In an embodiment the precursor vessel may comprise a plurality of support structures configured to operate as capacitively coupled electrodes by creating an electric field between them. For example, in the embodiment of FIG. 5 two or more spaced apart matrixes 7 may be arranged along the height of the vessel's interior portion 2, whereby at least one matrix is electrically connected to a first electrode 4, and at least one other matrix is electrically connected to another electrode 4'. Further, a plurality of such support structures may be arranged throughout the interior portion, along the height or width.

Figure 6:
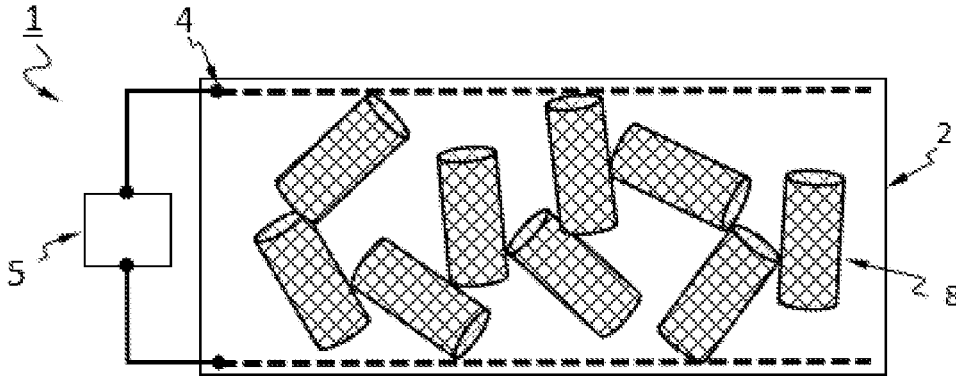
FIG. 6 shows an embodiment of a capacitive sensor system 1 comprising a support structure in the form of a plurality of substrates 8 stacked in a precursor vessel's interior portion 2, that are configured as an electrode 4.

With reference to FIG. 6, another embodiment of a support structure is described which comprises a substrate 8 mounted within said vessel's interior portion. Preferably the substrate comprises a plurality of porous substrates, granules, and/or grids, preferably stacked onto each other. Similarly to the embodiment of FIG. 5, the substrate 8 may be electrically connected to at least one electrode 4, or form an electrode by being directly connected to controller 5.

Figure 7:
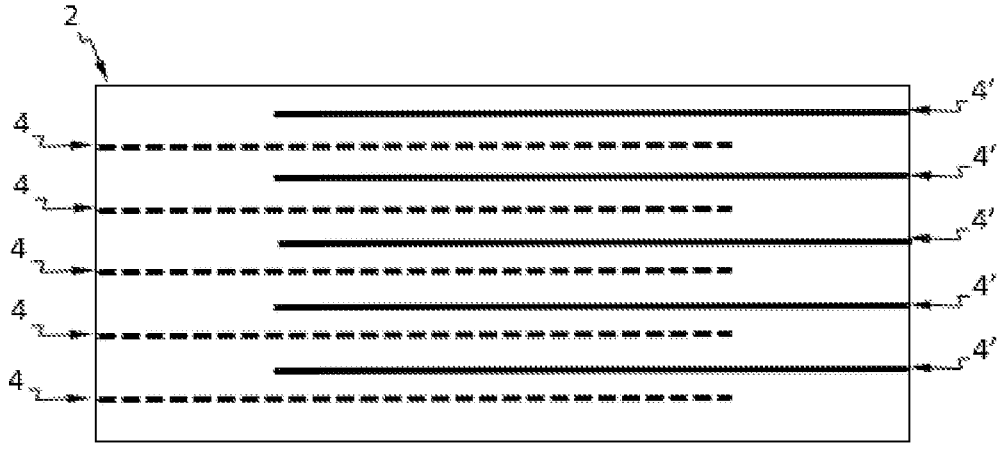
FIG. 7 shows an embodiment of a capacitive sensor system 1 comprising a plurality of capacitively coupled electrode pairs 4, 4' arranged as a ladder structure in a precursor vessel's interior portion 2.

With reference to FIG. 7, an embodiment is described wherein the precursor vessel comprises a plurality of electrode pairs 4, 4' that are capacitively coupled to thereby form a plurality of electrode units; wherein said plurality of electrode units is mounted within the vessel's interior portion. The controller may be configured to apply an electrical to each one of said electrode units to thereby electrically excite them such that a plurality of electric fields is formed inside said vessel's interior portion. Preferably, the plurality of electrode units is mounted along a height of said precursor vessel, in an alternating manner.

More specifically in the embodiment of FIG. 7, the electrode units are arranged in a "ladder structure", with alternatingly one side of the ladder missing and the rungs interleaved. The capacitance is advantageously measured over the entire structure, not per individual rung, to avoid sensing hot spots.

An embodiment comprising electrodes in a ladder configuration has the advantage of increasing the surface area of the capacitive sensor, without sacrificing (too much) uniformity. Additionally, the increased length allows more longer gas flow throughout, thereby allowing for more efficient precursor pickup. The skilled person may appreciate that the distance at the end of a "rung" to the side of the opposite ladder is advantageously selected such that the electric field in this area is comparable to that between the rungs. Too large spacing can lead to a too weak signal whereas too small might be difficult to manufacture and may become clogged with precursor. Hence, the interelectrode distance is optimally selected based on the geometry and dimension of the interior portion to ensure that the entirety of the precursor can be measured.

Figure 8:
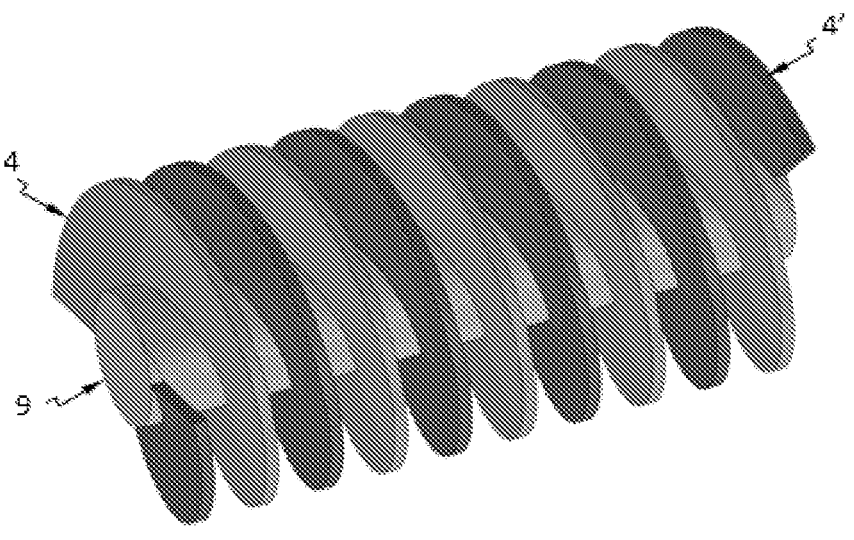
FIG. 8 shows an embodiment of a capacitive sensor system 1 comprising a pair of capacitively coupled electrodes 4, 4' arranged as a double helix structure in a precursor vessel's interior portion 2.

With reference to FIG. 8, an embodiment is described wherein the precursor vessel comprises a pair of electrodes 4, 4' mounted in a winding manner around at least a portion of a support member, thereby substantially forming a double helix around said support member. The portion of the supporting member holding the electrodes may be mounted inside within the vessel's interior portion, preferably along a height of said precursor vessel, so as to cover the portion containing the precursor. Specifically for cylindrical vessels, the double helix may advantageously be arranged with its rotation axis parallel to the rotation axis of a cylindrical vessel.

An embodiment comprising electrodes in a double helix configuration has the advantage of increasing the surface area, resulting in higher capacitance. Additionally, proper mounting of the support member may increase the gas flow path, resulting in enhanced precursor pickup. The distance between the pair of electrodes is advantageously selected to prevent agglomeration of precursor between the electrodes. Nonetheless, less spacing facilitates an easier measurement and may have other benefits such as providing a supporting structure for the precursor. Hence, the length of the support member and interelectrode distance is optimally selected based on the geometry and dimension of the interior portion to ensure that the entirety of the precursor can be measured.

Figure 9:
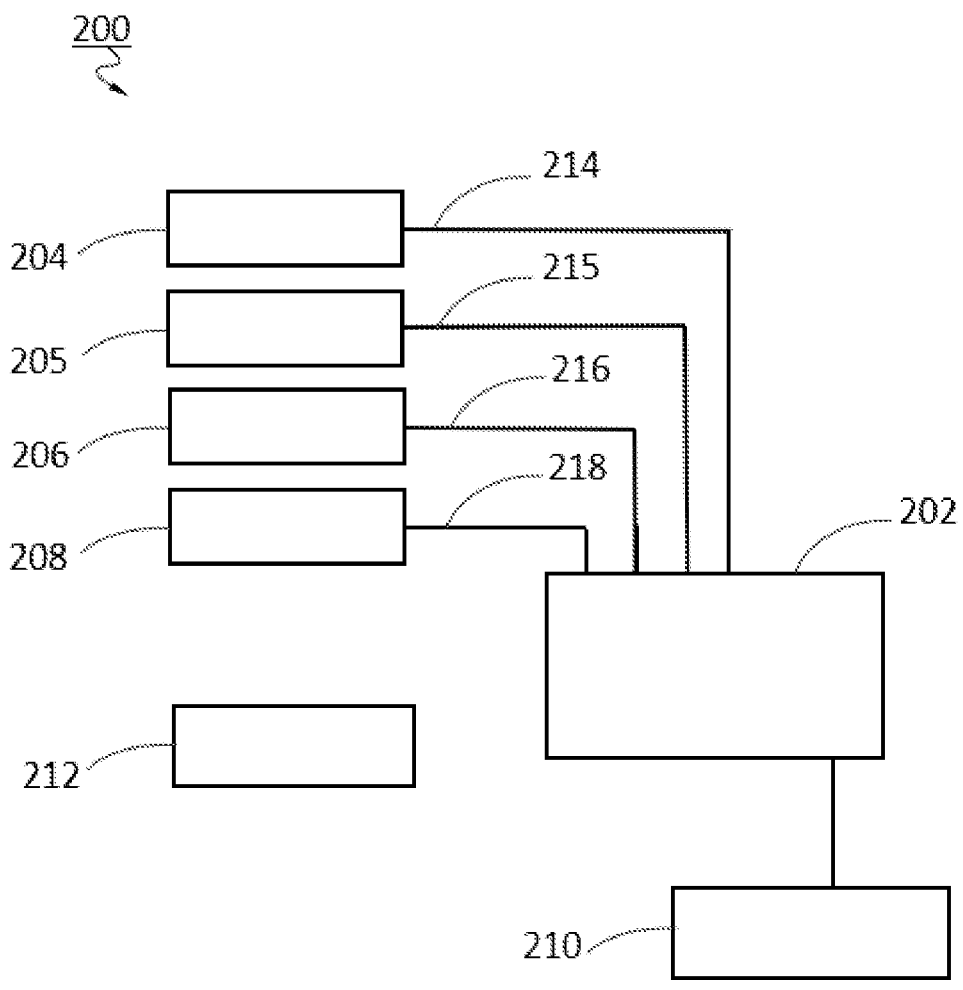
FIG. 9 shows an embodiment of a processing system 200 comprising one or more process chambers 202, a precursor gas source 204, a gas source 205, a reactant gas source 206, a purge gas source 208, an exhaust 210, and a process control unit 212.

FIG. 9 shows an embodiment of a processing system 200 comprising one or more process chambers 202, a precursor gas source 204, a gas source 205, a reactant gas source 206, a purge gas source 208, an exhaust 210, and a process control unit 212.

The process chamber 202 can include any suitable process chamber, such as an ALD or CVD reaction chamber.

The precursor gas source 204 can include a precursor vessel and one or more precursors as described herein—alone or mixed with one or more carrier (e.g. noble) gases. Suitably, at least one precursor vessel comprises a capacitive sensor system as described herein.

The reactant gas source 206 can include a vessel and one or more reactants as described herein—alone or mixed with one or more carrier gases. The purge gas source 208 can include one or more noble gases such as He, Ne, Ar, Kr, and/or Xe. Although illustrated with four gas sources 204-208, the system 200 can include any suitable number of gas sources. The gas sources 204-208 can be coupled to process chamber 202 via lines 214-218, which can each include flow controllers, valves, heaters, and the like. At least one of the gas sources comprises a capacitive sensor system 1 as disclosed herein.

The exhaust 210 can include one or more vacuum pumps.

The process control unit 212 includes electronic circuitry and software to selectively operate valves, manifolds, heaters, pumps and other components included in the system 200. Such circuitry and components operate to introduce precursors and purge gases from the respective sources 204-208. The process control unit 212 can control timing of gas pulse sequences, temperature of the substrate and/or process chamber, pressure within the process chamber, and various other operations to provide proper operation of the system 200. The process control unit 212 can include control software to electrically or pneumatically control valves to control flow of precursors, reactants and purge gases into and out of the process chamber 202. The process control unit 212 can include modules such as a software or hardware component, e.g., a FPGA or ASIC, which performs certain tasks. A module can advantageously be configured to reside on the addressable storage medium of the control system and be configured to execute one or more processes.

Other configurations of the system 200 are possible, including different numbers and kinds of precursor and reactant sources and purge gas sources. Further, it will be appreciated that there are many arrangements of valves, conduits, precursor sources, and purge gas sources that may be used to accomplish the goal of selectively feeding gases into the process chamber 202. Further, as a schematic representation of a system, many components have been omitted for simplicity of illustration, and such components may include, for example, various valves, manifolds, purifiers, heaters, containers, vents, and/or bypasses.

During operation of the reactor system 200, substrates, such as semiconductor wafers (not illustrated) are transferred from, e.g., a substrate handling system to the process chamber 202. Once substrates are transferred to the process chamber 202, one or more gases from the gas sources 204-208, such as precursors, reactants, carrier gases, and/or purge gases, are introduced into the process chamber 202.

The invention claimed is:

1. Method for determining an amount of solid precursor in a precursor vessel for a semiconductor manufacturing process, wherein the vessel has an interior portion configured for receiving and holding the solid precursor, comprising at least two electrodes that are arranged in a substantially parallel manner within the vessel, the method comprising the steps of:

applying an electrical signal to each one of the electrodes to electrically excite each electrode such that an electric field is formed inside the interior portion of the vessel;

capturing sensing data indicative of capacitance related to an amount of precursor within the electric field; and determining, based on the sensing data, the amount of precursor in the precursor vessel, wherein determining the amount of precursor in the precursor vessel comprises determining, based on the sensing data, a fraction of the interior portion of the vessel which contains precursor.

2. The method according to claim 1, wherein the electric field extends substantially uniformly throughout the precursor vessel, whereby electric field lines of the electric field are locally parallel.

3. The method according to claim 1, wherein the determining the amount of precursor further comprises applying a mathematical model that describes a relationship between the fraction and the amount of precursor in the precursor vessel based on calibration data.

4. The method according to claim 1, wherein the method further comprises the step of calculating a consumption rate of the precursor based on the sensing data over time.

5. The method according to claim 1, wherein the precursor vessel comprises a support structure mounted within the interior portion of the vessel to support precursor coated thereon; and wherein the support structure comprises one or more conductive material configured to operate as one or more electrodes.

6. The method according to claim 5, wherein the support structure comprises a non-conductive core material and a conductive peripheral material.

7. The method according to claim 5, wherein the support structure comprises at least one of a matrix, mesh, grid, fabric, screen, or perforated screen.

8. The method according to claim 5, wherein the support structure comprises at least one of a plurality of substrates, porous substrates, granules, or grids, stacked onto each other.

9. The method according to claim 1, wherein at least one electrode is mounted substantially along a bottom of the precursor vessel, and at least one electrode is mounted substantially along a top of the precursor vessel.

10. The method according to claim 1, wherein the precursor vessel comprises a pair of electrodes arranged in a cascading manner along a height of the precursor vessel, thereby substantially forming a plurality of alternating substantially horizontal and substantially vertical sections.

11. The method according to claim 1, wherein the precursor vessel comprises a support member; and wherein the electrodes are mounted in a winding manner around the support member, thereby substantially forming a double helix; and wherein the support member is mounted along a height of the precursor vessel.

12. The method according to claim 1, wherein the precursor vessel comprises a plurality of electrode pairs that are capacitively coupled to form a plurality of electrode units; wherein the plurality of electrode units is mounted along a height of the precursor vessel; and wherein the electrical signal is applied to each one of the electrode units to electrically excite each electrode unit such that a plurality of electric fields is formed inside the interior portion of the vessel.

13. The method according to claim 1, wherein at least one surface of an electrode is configured to prevent electrical arcing.

14. The method according to claim 13, wherein at least one surface of an electrode is covered by an insulating coating or comprises an insulating material mounted thereon.

15. The method according to claim 1, wherein the electrical signal applied to the electrodes has a voltage of 24 V or lower.

16. The method according to claim 1, wherein the electrical signal applied to the electrodes has a drive current of 50 µA or lower.

17. Capacitive sensor system for measuring an amount of solid precursor in a precursor vessel for a semiconductor manufacturing process, the vessel having an interior portion configured for receiving and holding the solid precursor, the system comprising:

at least two electrodes configured to be mountable within the interior portion in a substantially parallel manner;

a controller configured to apply an electrical signal to each one of the electrodes to electrically excite each electrode such that an electric field is formed inside the interior portion of the vessel, and capture sensing data indicative of capacitance related to an amount of precursor within the electric field; and a processing device communicatively coupled to the controller in order to receive the sensing data therefrom, and configured to determine, based on the sensing data, the amount of precursor in the precursor vessel which includes being configured to determine, based on the sensing data, a fraction of the interior portion of the vessel which contains precursor.

18. Processing system comprising a process chamber, a substrate handling system, and a precursor vessel, wherein the precursor vessel has an interior portion holding an amount of solid precursor; and the processing system comprises a capacitive sensor system comprising:

at least two electrodes configured to be mountable within the interior portion in a substantially parallel manner;

a controller configured to apply an electrical signal to each one of the electrodes to electrically excite each electrode such that an electric field is formed inside the interior portion of the vessel, and capture sensing data indicative of capacitance related to an amount of precursor within the electric field; and a processing device communicatively coupled to the controller in order to receive the sensing data therefrom, and configured to determine, based on the sensing data, the amount of precursor in the precursor vessel.

19. The processing system according to claim 18 further comprising a process control unit configured for causing the processing system to carry out a method comprising:

applying an electrical signal to each one of the electrodes to electrically excite each electrode such that an electric field is formed inside the interior portion;

capturing sensing data indicative of capacitance related to the amount of precursor within the electric field; and determining, based on the sensing data, the amount of precursor in the precursor vessel.

20. The processing system according to claim 18, wherein the processing device configured to determine the amount of precursor in the precursor vessel comprises being configured to determine, based on the sensing data, a fraction of the interior portion of the vessel which contains precursor.

* * * * *